United States Patent
Pickerd et al.

(10) Patent No.: US 7,474,972 B2
(45) Date of Patent: Jan. 6, 2009

(54) BANDWIDTH MULTIPLICATION FOR A TEST AND MEASUREMENT INSTRUMENT USING NON-PERIODIC FUNCTIONS FOR MIXING

(75) Inventors: John J. Pickerd, Hillsboro, OR (US); Kan Tan, Beaverton, OR (US); Thomas C. Hill, III, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 11/690,797

(22) Filed: Mar. 23, 2007

(65) Prior Publication Data

US 2008/0231488 A1 Sep. 25, 2008

(51) Int. Cl.
*G01R 23/00* (2006.01)
*G01R 19/00* (2006.01)

(52) U.S. Cl. .................. 702/75; 702/76; 702/189; 324/76.11; 324/76.23; 341/118; 341/120

(58) Field of Classification Search .............. 702/75, 702/76, 189; 324/76.22, 76.23, 76.24; 341/118, 341/120; 375/225, 316
See application file for complete search history.

(56) References Cited

U.S. PATENT DOCUMENTS

| | | | |
|---|---|---|---|
| 4,594,555 A | | 6/1986 | Hilton |
| 4,669,051 A | * | 5/1987 | Barr, IV ............... 702/191 |
| 5,059,892 A | * | 10/1991 | Stoft ................ 324/73.1 |
| 5,524,281 A | * | 6/1996 | Bradley et al. ....... 455/67.15 |
| 5,745,839 A | * | 4/1998 | Lieberman ............ 455/10 |
| 5,939,887 A | * | 8/1999 | Schmidt et al. ........ 324/628 |
| 5,974,362 A | * | 10/1999 | Owen ................. 702/107 |
| 6,380,879 B2 | | 4/2002 | Kober et al. |
| 6,425,132 B1 | * | 7/2002 | Chappell .............. 725/107 |
| 6,636,816 B1 | * | 10/2003 | Dvorak et al. .......... 702/66 |
| 6,654,595 B1 | * | 11/2003 | Dexter ............... 455/323 |
| 6,711,145 B2 | * | 3/2004 | Schilling ............. 370/335 |
| 6,748,015 B2 | * | 6/2004 | Kohli et al. ........... 375/150 |
| 6,980,147 B2 | | 12/2005 | Mathis et al. |
| 7,058,548 B2 | | 6/2006 | Pupalaikis et al. |
| 7,219,037 B2 | | 5/2007 | Pupalaikis et al. |
| 7,257,497 B2 | * | 8/2007 | Pickerd ............... 702/57 |
| 2006/0057996 A1 | * | 3/2006 | Petrovic et al. ........ 455/260 |
| 2006/0074606 A1 | * | 4/2006 | Pupalaikis et al. ...... 702/189 |
| 2006/0215744 A1 | * | 9/2006 | O'Neill .............. 375/224 |
| 2006/0247870 A1 | * | 11/2006 | Pickerd ............... 702/57 |
| 2007/0298733 A1 | * | 12/2007 | Cole et al. ........... 455/114.2 |

FOREIGN PATENT DOCUMENTS

WO WO2004/038432 A2 5/2004

* cited by examiner

*Primary Examiner*—Linh V Nguyen
(74) *Attorney, Agent, or Firm*—Derek Meeker; Thomas F. Lenihan

(57) ABSTRACT

An acquisition apparatus for a test and measurement instrument including a splitter configured to split an input signal into a plurality of split signals, a plurality of oscillators, each oscillator configured to generate a periodic signal, a plurality of combiners, each combiner configured to combine an associated plurality of the periodic signals into an associated signal combination where at least one of the signal combinations is substantially non-periodic. The apparatus also includes a plurality of mixers, each mixer configured to mix an associated split signal and an associated signal combination into an associated mixed signal, a first digitizer configured to digitize an associated split signal, and a plurality of second digitizers, each second digitizer configured to digitize an associated mixed signal.

24 Claims, 16 Drawing Sheets

US 7,474,972 B2

BANDWIDTH MULTIPLICATION FOR A TEST AND MEASUREMENT INSTRUMENT USING NON-PERIODIC FUNCTIONS FOR MIXING

BACKGROUND

This invention relates to test and measurement instruments and, more particularly, to test and measurement instruments using non-periodic functions for bandwidth multiplication.

Digital oscilloscopes have limited input bandwidths. The bandwidth of an input signal is limited to the input bandwidth of the oscilloscope. In U.S. Patent Application Publication 2004/0128076 to Pupalaikis, et al., a real-time oscilloscope is disclosed with an increased usable bandwidth. The real-time oscilloscope splits the input signal into multiple split signals. One split signal is digitized. Simultaneously, the other split signals are frequency shifted to a baseband frequency range and digitized. The digitized frequency-shifted signals are frequency shifted to their original frequency range and then combined with the other digitized signals to create a representation of the input signal. By frequency shifting sub-bands of the input signal to be within the bandwidth of their respective digitizers, an input signal having a frequency range larger than the input bandwidth of a digitizer may be acquired using the lower bandwidth digitizers.

However, periodic signals are used in frequency shifting the sub-bands to be within the bandwidth of a digitizer. As a result, detrimental effects from coherent spurious components are more pronounced.

Accordingly, a need remains for an improved method and apparatus for reconstructing signals from sub-band signals.

SUMMARY

An acquisition apparatus for a test and measurement instrument includes a splitter configured to split an input signal into a plurality of split signals, a plurality of oscillators, each oscillator configured to generate a periodic signal, and a plurality of combiners, each combiner configured to combine an associated plurality of the periodic signals into an associated signal combination where at least one of the signal combinations is substantially non-periodic. The apparatus also includes a plurality of mixers, each mixer configured to mix an associated split signal and an associated signal combination into an associated mixed signal, a first digitizer configured to digitize an associated split signal, and a plurality of second digitizers, each second digitizer configured to digitize an associated mixed signal.

A method of digitizing an input signal for a test and measurement instrument includes splitting an input signal into a plurality of split signals, combining a plurality of periodic signals into a plurality of signal combinations where each signal combination is substantially non-periodic, mixing each signal combination with an associated split input signal to generate an associated mixed signal, digitizing the input signal, digitizing each mixed signal, calculating a plurality of sub-bands in response to the digitized input signal and the digitized mixed signals, and combining the sub-bands into a reconstructed signal.

DETAILED DESCRIPTION

This disclosure describes embodiments of a test and measurement instrument using non-periodic functions for mixing to achieve bandwidth multiplication. A result, operations of such test and measurement instruments can provide an increase in the bandwidth and sample rate relative to a single analog oscilloscope channel.

Higher frequency components of an input signal will be distorted or eliminated if digitized with a digitizer having a lower bandwidth. To overcome the bandwidth limitation, higher frequency components are down-converted to be within the bandwidth of the digitizer. Thus, those frequency components can be digitized accurately.

Figure 1:
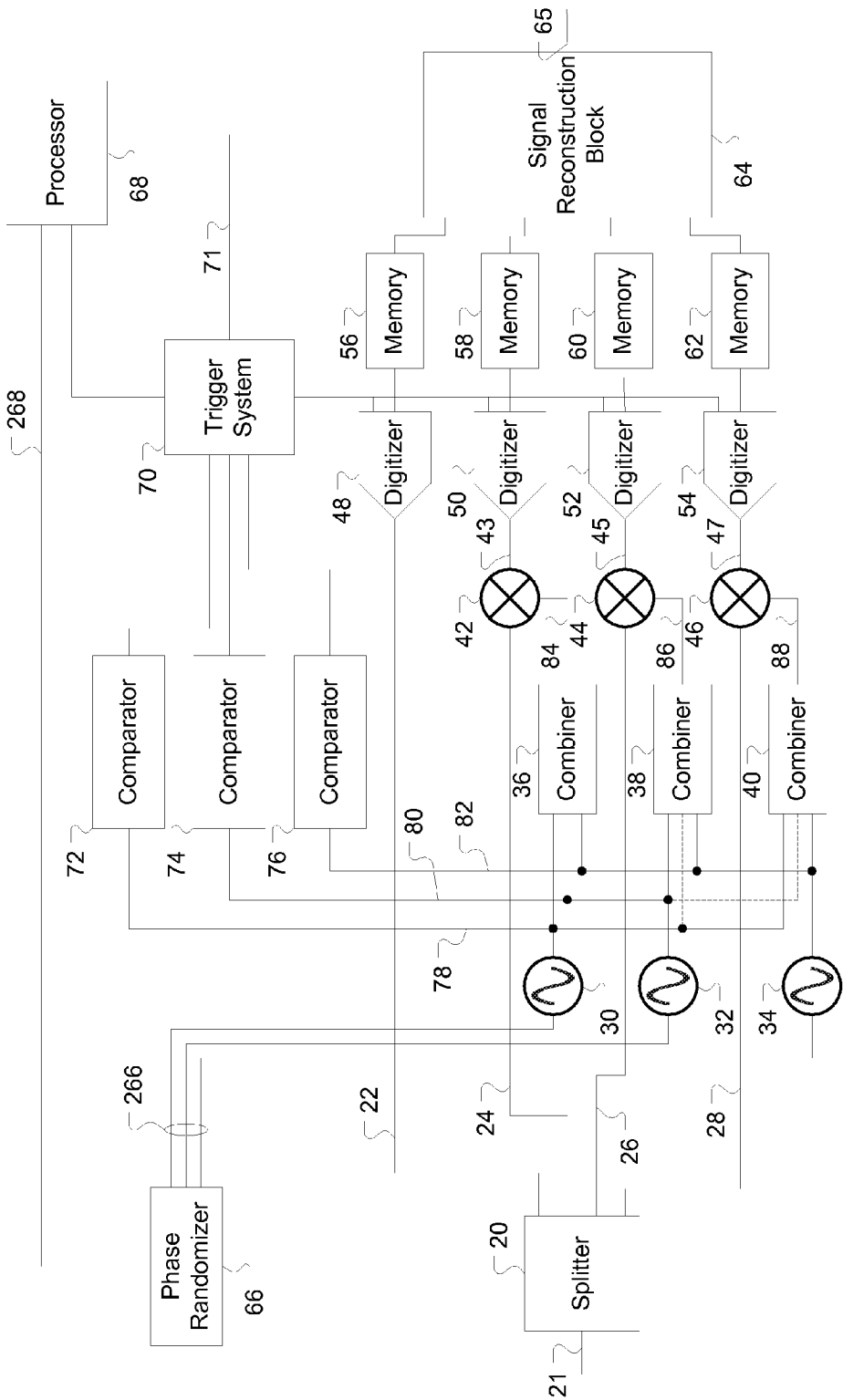
FIG. 1 is a block diagram of a test and measurement instrument using non-periodic functions for mixing according to an embodiment of the invention.

FIG. 1 is a block diagram of a test and measurement instrument using non-periodic functions for mixing according to an embodiment of the invention. The test and measurement instrument includes a splitter 20, oscillators 30, 32, and 34, combiners 36, 38, and 40, mixers 42, 44, and 46, digitizers 48, 50, 52, and 54, memories 56, 58, 60, and 62, and a signal reconstruction block 64. An example of such a test and measurement instrument is an oscilloscope platform. Another example of a digitizing platform is a spectrum analyzer. Any instrument with a goal of converting an analog waveform into a digital waveform represented by binary samples stored in memory can be implemented with an embodiment described herein.

A test and measurement instrument with four digitizing channels associated with the four digitizers 48, 50, 52, and 54 is illustrated in FIG. 1. Other embodiments of such a test and measurement instrument are not limited to four channels. As will be described below, so long as sufficient channels are available to provide signals to isolate sub-bands of the input signal 21 from mixed signals, any number of channels can be used. Thus, although four split signals have been described, any number of split signals can be used according to the size and complexity of the test and measurement instrument.

The splitter 20 is configured to split an input signal 21 into a plurality of split signals 22, 24, 26, and 28. The splitter 20 can be a variety of splitters. In one example, the splitter 20 is a resistive power divider.

In one embodiment, the splitter 20 is configured to split the input signal 21 into split signals 22, 24, 26, and 28 such that the spectrums of the split signals 22, 24, 26, and 28 are substantially identical. Substantially identical includes variations caused by component variations. For example, a splitter 20 may be designed to produce identical split signals 22, 24, 26, and 28; however, each split signal can be slightly different. Such split signals 22, 24, 26, and 28 are still considered substantially identical.

In another embodiment, the splitter 20 is configured to split the input signal 21 into split signals 22, 24, 26, and 28 having unequal spectrums. As will be described below, various frequency components of each split signal contribute to the reconstructed signal. However, for proper reconstruction, all of the frequency components can, but need not pass through each path. Thus, in one embodiment each split signal 22, 24, 26, or 28 needs only the frequency components of the input signal 21 that will be used from that split signal in the reconstructed signal. Accordingly, the splitter 20 can split the input signal 21 such that the split signals 22, 24, 26, and 28 have the desired spectrums.

In an embodiment, a non-periodic function is applied to each mixer 42, 44, and 46. This is achieved by using a sum of multiple periodic signals 78, 80, and 82 as the local oscillator input for each mixer 42, 44, and 46. The oscillators 30, 32, and 34 are configured to generate the periodic signals 78, 80, and 82. For example, the periodic signals 78, 80, and 82 can be sine waves. In one embodiment, frequencies of the periodic signals 78, 80, and 82 are selected such that that a cycle time of one oscillator is not an integer multiple of another oscillator.

In another embodiment, the frequencies of the periodic signals 78, 80, and 82 are selected such that a combination of any two is non-periodic. The combination is non-periodic if a ratio of the two cycle times is an irrational number. For example, for a first cycle time T1 of a first periodic signal and a second cycle time T2 of a second periodic signal, there could exist $$T_1 K_1 = T_2 K_2 \qquad (1)$$

For a combination of periodic signals having unequal, non-multiple cycle times to eventually have the same phase, there must exist some set of K1 and K2 where both K1 and K2 are integers. After K1 cycles of the first periodic signal, K2 cycles of the second periodic signal would have passed, making the periodic signals have the same relative phase as when they started. Thus, the combination would be periodic. Rewriting equation 1 results in equation 2.

$$\frac{T_1}{T_2} = \frac{K_2}{K_1} \qquad (2)$$

In equation 2, the ratio of the cycle times T1 and T2 is the ratio of the integers K2 and K1. However, if the ratio of cycle times is an irrational number, then by definition, there does not exist any fraction K2 over K1 where K1 and K2 are integers. Thus, there is no number of K1 cycles of the first periodic signal or K2 cycles of the second periodic signal after which the combination will repeat. As a result, the combination is non-periodic.

The frequencies of the periodic signals, in addition to having the non-periodic properties described above, have the appropriate values to shift associated sub-bands to base-band. The frequencies can be such that overlap of bands is incorporated for better reconstruction as will be described below.

A non-periodic signal is a signal that cannot be divided into fixed time periods in which the signal in each time period is identical to the signal in the other time periods. Portions of the signal can repeat; however, there is no fixed repeating interval over which the signal repeats.

A substantially non-periodic signal is a signal that can be periodic, yet is non-periodic over a time period of interest. For example, as will be described below, a signal may need to be non-periodic only over a acquisition period. Such a signal would be referred to as substantially non-periodic since the cycle time of the periodicity of the signal is greater than the time of interest.

To the extent that a signal is non-periodic, it lacks coherency of frequency or exact repetition in time. Therefore by that same amount it lacks coherent spurious components. When used for frequency converting incoming signal bands down to a baseband, any coherent spurious signals can be difficult to remove. Non-coherent spurious signals will be spread in frequency and thus have a reduced impact on signal quality.

The combiners 36, 38, and 40 are each configured to combine associated periodic signals into an associated signal combination. The combiners 36, 38, and 40 sum together the periodic signals. In this embodiment, each combiner 36, 38, and 40 combines each periodic signal 78, 80, and 82 into the associated signal combination 84, 86, and 88. In another embodiment, combiner 36 combines periodic signals 78 and 82 into signal combination 84. Combiner 38 combines periodic signals 80 and 82 into signal combination 86. Combiner 40 combines periodic signals 78 and 82 into signal combination 88. Thus, signal combinations 84, 86, and 88 can combine from one to all of the periodic signals 78, 80, and 82 provided that at least one signal combination is substantially non-periodic.

The combiners 36, 38, and 40 combine the periodic single 78, 80, and 82 with different weights. Each periodic signal is weighted by a complex coefficient before it is summed by the power combiners. The coefficient weighting may be performed by filter circuits. Any circuit that modifies phase and amplitude can be thought of as a filter and can apply the coefficients to the associated periodic signal.

This weighting is performed on the periodic signals and can be in the form of weight of a+jb where j is the square root of minus one. The variables a and b are real numbers. One of a and b can be zero.

In an embodiment, each periodic signal is multiplied by a complex coefficient such that three sets of linearly independent equations can be written for the signal reconstruction after acquisition. In one example, the coefficients for the combiner 36 are −1, 1, and 1 for periodic signals 78, 80, and 82, respectively. The coefficients for the combiner 38 are 1, −1, and 1. The coefficients for the combiner 40 are 1, 1, −1.

In another example, each signal combination 84, 86, and 88 need not include each periodic signal 78, 80, and 82. In this example, the coefficients can be −1, 0, and 1; 0, −1, and 1; and 1, 0, and −1. Linear independent equations can still be formed with such coefficients.

Dashed lines have been used in FIG. 1 to illustrate both this example and the above example of coefficients. Thus, to illustrate the coefficients with non-zero coefficients for each periodic signal 78, 80, and 82, the combiners 36, 38, and 40 are illustrated as having connections to each oscillator 30, 32, and 34. To illustrate the example with a coefficient of zero for each combiner 36, 38, and 40, the connections illustrated by the dashed lines can be omitted. As a result, each combiner would have connections to only two of the three oscillators 30, 32, and 34. However, in the event a coefficient is zero, the connection to the corresponding oscillator can, but need not be eliminated. For example, in the corresponding combiner, the periodic signal could be switched out of the combination, terminated into a load, or otherwise not added to the resulting signal combination.

When coefficients such as 1 and −1 are selected, a simpler analog circuit can be used because a coefficient of −1 is implemented by a 180 degree phase shift of the periodic signal. This reasoning can be extended to more then three channels with mixers. In some embodiments, there will always be one channel that does not have a mixer and there will be no oscillator coefficients of this type associated with that channel.

Each mixer 42, 44, and 46 is configured to mix an associated split signal and an associated signal combination into an associated mixed signal. For example, mixer 42 is configured to mix split signal 24 with signal combination 84 into mixed signal 43. Similarly, mixers 44 and 46 mix split signals 26 and 28 with signal combinations 86 and 88 into mixed signals 45 and 47, respectively. Each mixer 42, 44, and 46 can receive a signal of bandwidth approximately equal to four times the bandwidth of a single digitizer 48. Each mixer 42, 44, and 48 should be capable of handling frequency components of the input signal 21 associated with the periodic signals in the signal combinations 84, 86, and 88.

The test and measurement instrument includes digitizers 48, 50, 52, and 54. Although not illustrated, each digitizer 48, 50, 52, and 54 can have a preamplifier, attenuators, and other analog circuitry in the analog channel as needed. Thus, the input signals to the digitizers 48, 50, 52, and 54 can be amplified, attenuated, or otherwise filtered before digitization. In addition, the digitizers 48, 50, 52, and 54 can include circuitry such as track and hold circuits, A/D converters, de-multiplexer circuits as needed to sample the waveform and store it in respective memories 56, 58, 60, and 62.

The bandwidth of each digitizer 48, 50, 52, and 54 can be approximately ¼ times the desired bandwidth of the input signal 21. Since each sub-band of the input signal 21 is within or can be frequency shifted to be within the bandwidth of the digitizers, the bandwidth of the digitizers can be less than the desired bandwidth of the input signal 21. The digitizers 48, 50, 52, and 54 can, but need not be identical, so long as each digitizer is capable of digitizing the associated frequency-shifted sub-bands.

Digitizer 48 is configured to digitize split signal 22. In contrast, digitizers 50, 52, and 54 are configured to digitize mixed signals 43, 45, and 47, respectively. As will be described below, the digitized split signal 22 can be used in isolating the sub-bands.

Although the mixers 42, 44, and 46 have been illustrated as coupled directly to the corresponding digitizers 50, 52, and 54, other components can be interposed between the mixers and digitizers. For example, a switch can select between a mixer output and another input. Thus, the extended bandwidth functionality could be switched off by the user, allowing each channel to be used as a normal channel.

The test and measurement instrument can include a phase randomizer 66. The phase randomizer 66 is coupled to the oscillators 30, 32, and 34. Phases of the periodic signals 78, 80, and 82 are responsive to the phase randomizer 66.

As described above, non-periodic or substantially non-periodic signals are mixed with the split signals 24, 26, and 28. In an embodiment, the phases of the periodic signals 78, 80, and 82 can be adjusted to create a greater degree of non-periodicity. The adjustment of the phases can be implemented regardless of whether the signal combinations 84, 86, and 88 are non-periodic or substantially non-periodic.

The phase shift from the phase randomizer 66 can be introduced at a random time. As a result, another degree of randomization can be added to the signal combinations to improve non-periodicity.

In another embodiment, the phase shift from the phase randomizer 66 can be introduced at regular intervals. For example, the phase randomization can occur with each acquisition period of the digitizers 48, 50, 52, and 54. Thus, each acquisition period would have a different phase relationship between the periodic signals 78, 80, and 82. Before the start of each acquisition the processor 68 can send a phase control signal 268 that would cause the phase randomizer 66 to reset the oscillator phase.

Figure 2:
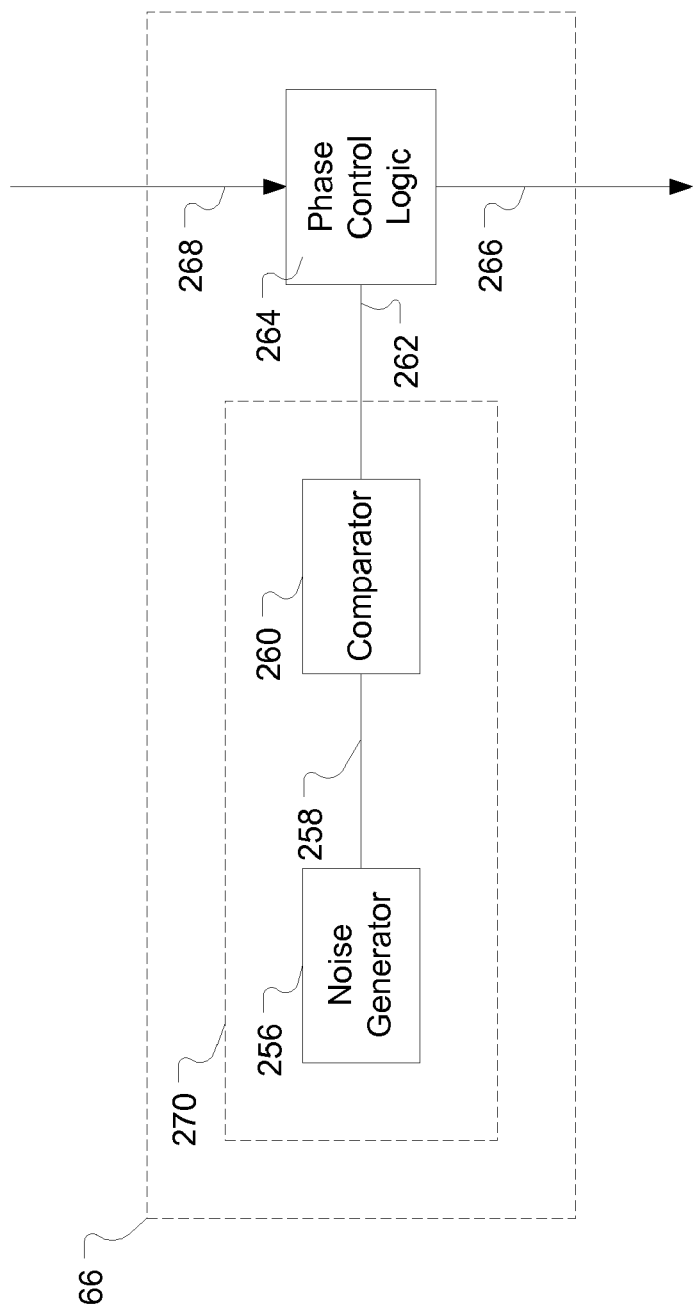
FIG. 2 is a block diagram of an example of a phase randomizer of FIG. 1.

FIG. 2 is a block diagram of an example of a phase randomizer of FIG. 1. The phase randomizer 66 can include a random signal generator 270. The phases of the periodic signals are responsive to the random signal generator 270. In this example, the random signal generator 270 is configured to generate a clipped noise signal 262. The clipped noise signal 262 is a digital signal having edges that occur randomly. The clipped noise signal 262 provides the phase control logic 264 with a random signal source for adjusting the phases of the periodic signals.

The phase control logic 264 is responsive to the phase control signal 268 and the clipped noise signal 262. In response, the phase control logic 264 is configured to generate phase adjustment signals 266. The oscillators 30, 32, and 34 are responsive to the phase adjustment signals 266.

In one embodiment, each oscillator is configured to receive a corresponding one of the phase adjustment signals 266. Each of the phase adjustment signals 266 can, but need not be changed at any one time. For example, the phase control signal 268 can set the phase control logic 264 to be ready to change the phase of oscillator 30. When the clipped noise signal 262 transitions, the phase adjustment signal 266 corresponding to the oscillator 30 can be activated. Thus, the phase of the periodic signal 78 is adjusted, changing the phase relationship of the periodic signals 78, 80, and 82.

Although one oscillator and periodic signal have been described as changing in response to the clipped noise signal 262, any number from zero to all of the phase adjustment signals 266 can be activated. For example, if the phase control signal 268 indicates that no phases of the periodic signals 78, 80, and 82 are to be changed, then regardless of what the clipped noise signal 262 indicates, the phase adjustment signals 266 are activated. In another example, the phase control signal 268 can indicate that all of the phases of the periodic signals 78, 80, and 82 are to be changed.

In one embodiment, the phase randomizer includes a noise generator 256, and a comparator 260. The noise generator 256 is configured to generate a noise signal 258. In one example, the noise generator 256 is a Gaussian noise generator. Thus, the noise signal 258 is a Gaussian noise signal.

The comparator 260 is configured to compare the noise signal 258 to a threshold to generate the clipped noise signal 262. As a result, amplitude variations of the noise signal 258 are removed, and only the random threshold-crossings remain. Since the noise signal 258 is varying randomly, the times when the comparator 260 will change state will vary randomly. Thus, the clipped noise signal 262 will have transitions that occur at random times.

Since the phase randomizer 66 can randomly adjust the phases of the periodic signals 78, 80, and 82, the resulting signal combinations can be non-periodic even if the combination of the periodic signals 78, 80, and 82 would only have resulted in a substantially non-periodic combination. This insures a short term non-periodic function at the mixers. The oscillator phase randomizer described above insures long term non-periodic behavior.

Referring back to FIG. 1, the test and measurement instrument can include comparators 72, 74, and 76, and trigger system 70. As described above, the random phase shifts can occur every acquisition period. Thus, the random phase shifts can be changed for each trigger. As will be described below, the phases of the periodic signals 78, 80, and 82 can be used in the signal reconstruction block 65 during reconstruction of the input signal 21. To provide the phase information of the periodic signals 78, 80, and 82, comparators 72, 74, and 76 are configured to detect a crossing of an associated one of the periodic signals 78, 80, and 82. As a result, the trigger system 70 has input signals that indicate the phases of the periodic signals 78, 80, and 82. In one embodiment, the trigger system 70 measures the time from a trigger to the time transitions are received from the comparators 72, 74, and 76. Since the digitization of the digitizers 48, 50, 52, and 54 are responsive to the trigger system 70, the time relationship of the periodic signals 78, 80, and 82 to the digitized signals can be determined.

The purpose is to measure the time from the trigger to the phase reference point for each of the periodic signal 78, 80, and 82 for each triggered acquisition. As a result, the periodic signals 78, 80, and 82 can be correctly aligned to the digitized waveforms with respect to the trigger position. This alignment is useful in reconstruction of the input signal 21. The measurement of the time from the trigger can be implemented with a variety of circuit configurations that would be capable of measuring time for each periodic signal 78, 80, and 82.

An example of such a circuit to measure the phase of the periodic signals 78, 80, and 82 is similar to circuits that measure the time from the trigger to the sample clock. In contrast, in this application it is the time from the trigger to a transition of the output of a comparator 72 that is measured. In one example, such circuits use constant current sources charging a capacitor in order to measure the required time interval. Other circuits could be devised to perform the same measurement to measure this time.

Although not illustrated, the trigger system 70 can receive a trigger signal from an external source or an internal source. Examples of the internal source include the input signal 21, and the split signal 22. Thus, the trigger could be generated in response to the input signal 21.

Processor 68 is coupled to the phase randomizer 66 and the trigger system 70. In one embodiment, the processor 68 can control the triggering and the phase adjustment. For example, the phase adjustment can be performed every acquisition cycle. Thus, the processor 68 can engage the phase randomizer 66 to change the phases of at least one of the periodic signals 78, 80, and 82. Then the processor 68 can control the trigger system 70 to trigger an acquisition.

Although processor 68 has been illustrated as a distinct component, the processor 68, trigger system 70, phase randomizer 66, signal reconstruction block 65, digitizers 48, 50, 52, and 54, and memories 56, 58, 60, and 62 can all be part of a common processing component. For example, a digital signal processor (DSP), microprocessor, programmable logic device, or other processing system with appropriate peripheral devices can implement the functionality of the above described components. In other examples, each block can be implemented discretely. Any variation between complete integration to fully discrete components can be implemented.

Figure 3:
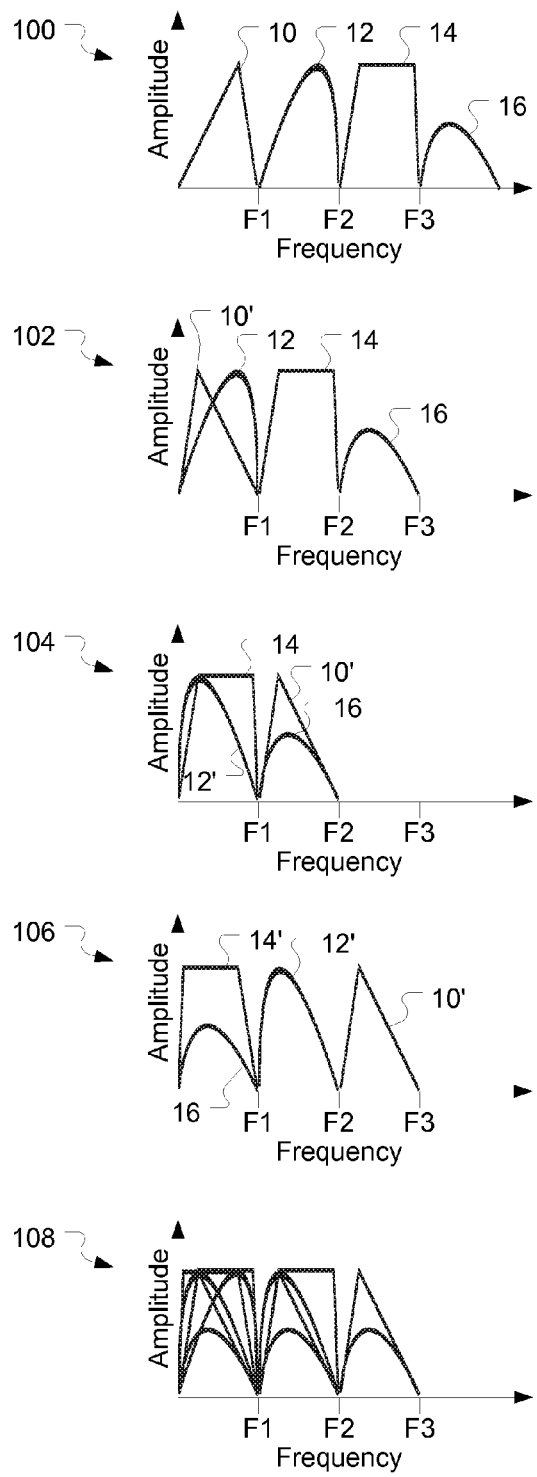
FIGS. 3 and 4 are diagrams illustrating components of signals in a test and measurement instrument of FIG. 1.
Figure 4:
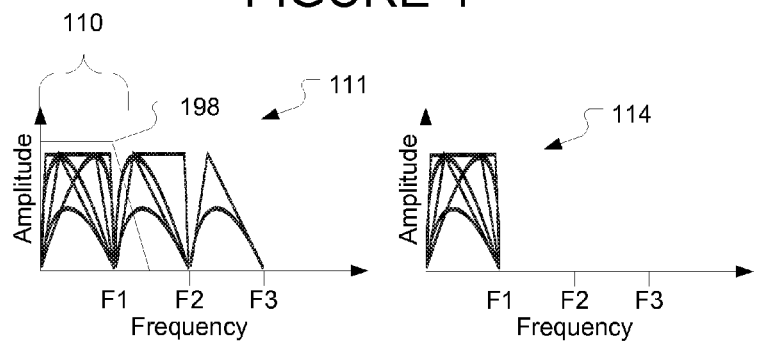

FIGS. 3 and 4 are diagrams illustrating components of signals in a test and measurement instrument of FIG. 1. Referring to FIG. 2, graph 100 is an example of a spectrum of an input signal 21. Amplitude is on the Y-axis and frequency is on the X-axis. The spectrum of the input signal 21 has been divided into sub-bands 10, 12, 14, and 16. Sub-band will be used in this discussion to refer to a band of frequency components within the input signal 21. A sub-band may be shifted in frequency, phase, mirrored about a frequency axis, or the like; however, it will still be referred to as the same sub-band. Sub-bands that are mirrored will be referred to with the prime modifier. For example, a mirrored sub-band 10 will be referred to as 10'.

Frequencies F1, F2, and F3 correspond to the frequencies of the periodic signals 78, 80, and 82. These frequencies have been used to define the sub-band ranges. Thus, in the input signal 21, sub-band 10 extends from 0 Hz to F1, sub-band 12 extends from F1 to F2, sub-band 14 extends from F2 to F3 and sub-band 16 extends from F3 onward, or to a selected endpoint.

Although different shapes of the spectrums of the sub-bands 10, 12, 14, and 16 have been illustrated in graph 100, the spectrum can take any shape according to the input signal 21. The shapes have been selected only to aid in explanation. In addition, although a null is illustrated at each frequency F1, F2, and F3, the input signal 21 and consequently, the sub-bands 10, 12, 14, and 16 can have frequency components extending up to and including frequencies F1, F2, and F3. The nulls are used only to aid in explanation.

Graphs 102, 104, and 106 illustrate the spectrums of mixed signals 43, 45, and 47, respectively, where the input signal 21 is mixed with one of the periodic signals 78, 80, and 82. Although graphs 102, 104, 106, and 108 illustrate frequency components where the input signal 21 was mixed down in frequency by one or more periodic signals, as a result of the mixing process, frequency components the input signal 21 may have been mixed up in frequency. For example, while sub-band 10' in graph 102 corresponds to sub-band 10 mixed down in frequency, sub-bands 10, 12, 14, and 16 may have been mixed up in frequency to begin above frequency F1. Such sub-bands that are mixed up in frequency are not illustrated because they will be filtered out either by the limited bandwidth of a digitizer 50, 52, or 54, or by other filtering in the instrument.

Graph 102 indicates the spectrum when the input signal 21 is mixed with periodic signal 78 having a frequency of F1. Thus, sub-bands 12, 14, and 16 are shifted down in frequency by F1. In addition, sub-band 10 has been reflected about frequency F1 and shifted down in frequency by F1 into mirrored sub-band 10'.

As described above, the mixed signals 43, 45, and 47 are digitized through a bandwidth that is greater than frequency F1. As a result, after each sub-band 12, 14, and 16 is frequency shifted down to below about F1, it can be accurately digitized without the bandwidth limitations of the digitizers having a detrimental effect. Consequently, for convenience, this description will refer to the sub-bands as below about F1 as the sub-bands that will be digitized. However, frequencies above F1 can be digitized, and as will be described below, can be used in reconstruction of the input signal 21.

Furthermore, in this description, two sub-bands, including a frequency shifted sub-band and a frequency-shifted and mirrored sub-band will be referred to as a sub-band pair.

In graph 102, sub-band 12 has been shifted down into the bandwidth of a digitizer. In addition, sub-band 10' has been mirrored in frequency and occupies the same frequency bands as sub-band 12. As a result, a mixed signal that will be digitized will contain both sub-bands 10' and 12 regardless of which sub-bands are desired.

Similarly, graph 104 represents the spectrum of the input signal 21 mixed with a periodic signal with a frequency F2. Thus, sub-bands 14 and 16 are shifted down in frequency by F2 and sub-bands 10' and 12' are reflected about F2 and shifted down in frequency by F2. As a result, from the periodic signal with a frequency F2, two sub-bands 12' and 14 are within the bandwidth of a digitizer and form a sub-band pair.

Similarly, graph 106 represents the spectrum of the input signal 21 mixed with a periodic signal with a frequency F3. Thus, sub-band 16 is shifted down in frequency by F3 and sub-bands 10, 12, and 14 are reflected about F3 and shifted down in frequency by F3. As a result, from the periodic signal with a frequency F3, two sub-bands 14' and 16 are within the bandwidth of a digitizer and form a sub-band pair.

The spectrums in graphs 102, 104, and 106 represent the spectrum of mixed signals 43, 45, and 47 if the input signal 21 was mixed with only one periodic signal. However, as described above, the input signal 21 is mixed with a combination of the periodic signals 78, 80, and 82. As a result, a mixed signal will contain the sub-band pairs from each periodic signal 78, 80, and 82 included in the associated signal combination 84, 86, and 88.

Graph 108 represents an example of a mixed signal. In this example, the signal combination mixed with the input signal 21 is a sum of the periodic signals 78, 80, and 82 with frequencies F1, F2, and F3. As a result, the single mixed signal has sub-bands 12, 14, and 16 and mirrored sub-bands 10, 12, and 14. Thus, in this example, the single mixed signal in graph 108 that can pass through the bandwidth of a digitizer includes six sub-bands, or three sub-band pairs. Furthermore, additional signals above F1 have been illustrated to show where sub-bands of other signals appear.

Charts 102, 104, 106, and 108 only indicate magnitude and do not indicate phase. Using the three sets of coefficients 1, 1, and –1; 1, –1, and 1; and –1, 1, and 1; the same sub-band can have different phase relationships between mixed signals. For example, the last coefficient corresponding to the periodic signal with frequency F3 is –1 in the first set and 1 in the second set. Thus, referring to graph 106, in a mixed signal using the first coefficients, sub-band 16 will have a 180 degree phase. In a mixed signal using the second coefficients, the same sub-band 16 will have a 0 degree phase. Thus, although the mixed signals 43, 45, and 47 can have similar spectrums as in graph 108; however, the phase relationships of the sub-bands can be different.

FIG. 4 illustrates the relationship of a sub-band set to a mixed signal. A sub-band set is a group of sub-bands in a mixed signal that are used to reconstruct the input signal 21. In this example, the sub-band set 110 includes the sub-bands that are frequency shifted to below about frequency F1. In graph 111, magnitude 198 indicates the bandwidth of a digitizer.

Graph 114 shows a sub-band set relative to the mixed signal in graph 111. The digitizer bandwidth 198 can filter the mixed signal in graph 111. In addition, other filtering can be applied to result in the sub-band set in graph 114. Although the sub-band set has been illustrated as filtered to have only frequency components below about F1, the filtering can be performed to pass frequencies above about F1. For example, higher frequencies can be used in sub-band overlap reconstruction. For ease of explanation, the sub-band sets will be illustrated as having frequencies only below about F1.

Each digitized mixed signal, and the digitized input signal can be filtered with channel match filters. A channel match filter corrects the phase and magnitude errors of each of the acquisition channels. For example, and deviations from ideal performance in components such as the digitizers 48, 50, 52, and 54, the mixers 42, 44, and 46, the combiners 36, 38, and 40, the splitter 20, or any combination of components that affect the input signal's 21 contribution to the digitized signals. As a result, each digitized channel has a reduced impact from non-ideal components prior to and including digitization.

After filtering, each digitized signal can be interpolated. In one embodiment, each digitized signal is interpolated by a factor equal to the number of channels. In this example, the factor is four. Thus, each digitized signal is interpolated by a factor of four, quadrupling the number of samples for each digitized signal.

Such interpolation can be implemented in the digitizers 48, 50, 52, and 54. Alternatively, the interpolation can be a function of the signal reconstruction block 64. In addition, the interpolation may not be needed if the digitization is operating at a sample rate that is high enough to represent the desired bandwidth of the input signal.

This illustrates an aspect of the interpolation. The interpolation can, but need not result in a sample rate that is equal to the number of channels times the sample rate of one channel. The interpolated sample rate need only be sufficient to represent the desired bandwidth of the input signal.

Figure 5:
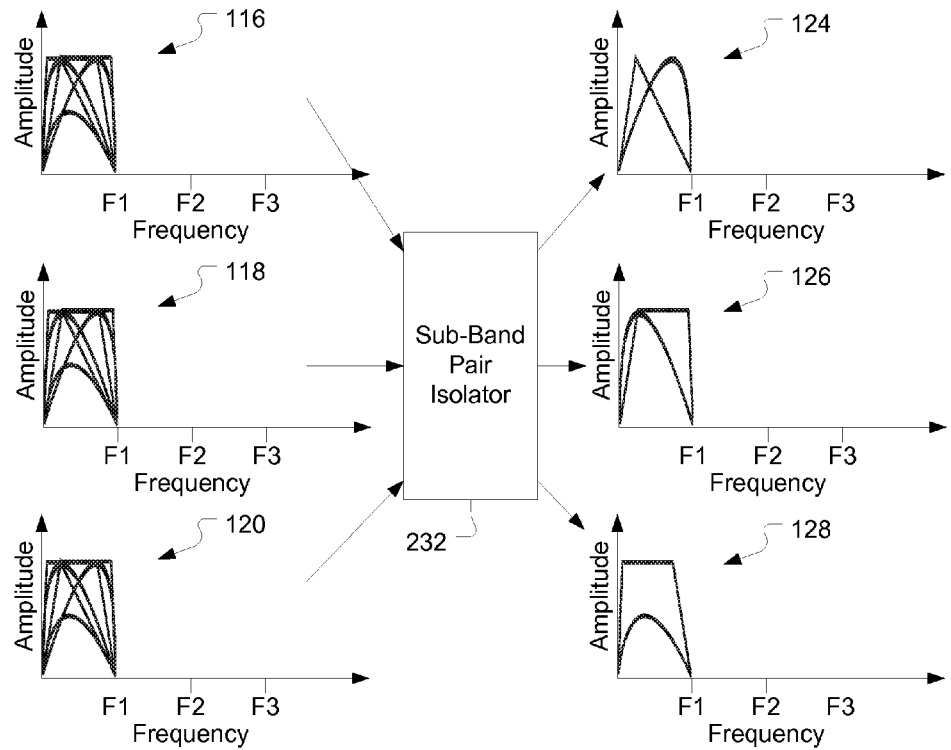
FIG. 5 is a diagram illustrating the isolation of sub-band pairs from signals in FIG. 4.

FIG. 5 is a diagram illustrating the isolation of sub-band pairs from signals in FIG. 4. Graphs 116, 118, and 120 represent the sub-band sets of the mixed signals 43, 45, and 47. As described above, magnitudes of the coefficients for the periodic signals in the signal combinations were all 1; however, some coefficients had a 180 degree phase shift. Thus, the magnitudes of the spectrums are similar if not identical, as reflected in the similarities of graphs 116, 118, and 120.

The sub-band pairs are isolated through a sub-band pair isolator 232. As will be described below, a sub-band pair isolator 232 can be part of the signal reconstruction block 64 of FIG. 1. The following equations describe the isolation of sub-band pairs from the sub-band sets. Let n represent the data index and N represent the total record length of samples to process, f is the frequency of a periodic signal and $f_s$ is the final sample rate.

$$n=0 \ldots N-1 \quad (3)$$

$$\omega(f) = \frac{2\pi f}{f_s} \quad (4)$$

In general, a phase of a signal at a particular frequency is related to time. For a digitized signal, a number of samples is related to time through the sample rate. Equation 5 generates a phase given a frequency and a number of samples.

$$\phi(f,k)=2\pi f k \quad (5)$$

Using equation 5, the phases of the periodic signals 78, 80, and 82 can be calculated. In one embodiment, the trigger system 70 provides the signal reconstruction block 64 with a number of samples from a trigger point to a threshold crossing of a periodic signal. In this example, k1, k2, and k3 correspond to the samples from the trigger to the threshold crossing for periodic signals 78, 80, and 82, respectively. Thus, equations 6-8 result in phases $\phi 1$, $\phi 2$, and $\phi 3$, indicating the phase shift of the corresponding periodic signals 78, 80, and 82, respectively, to the trigger signal.

$$\phi 1=\phi(f1,k1) \quad (6)$$

$$\phi 2=\phi(f2,k2) \quad (7)$$

$$\phi3=\phi(f3,k3) \tag{8}$$

$$\omega1=\omega(f1) \tag{9}$$

$$\omega2=\omega(f2) \tag{10}$$

$$\omega3=\omega(f3) \tag{11}$$

Although the phases φ1, φ2, and φ3 have been described as being calculated using a number of samples k1, k2, and k3, any value indicating the relationship of phases of the periodic signals to the trigger and/or sample clock can be used to calculate the phases φ1, φ2, and φ3.

Using this information, the sub-band pairs 124, 126, and 128 can be solved for from the sub-band sets 116, 118, and 120. Using an example of the coefficients described above, where yx(n) corresponds to the digitized sub-band sets and cx(n) corresponds to the sub-band pairs contributed by the respective periodic signals and x is an integer representing the channel:

$$\begin{bmatrix} y1(n) \\ y2(n) \\ y3(n) \end{bmatrix} = \begin{bmatrix} 1 & 1 & -1 \\ 1 & -1 & 1 \\ -1 & 1 & 1 \end{bmatrix} \begin{bmatrix} c1(n) \\ c2(n) \\ c3(n) \end{bmatrix} \tag{12}$$

Since the sub-band sets yx(n) are known, the sub-band sets yx(n) can be used with Equation 12 to solve for the unknown sub-band pairs, represented by cx(n). Thus, digitized signals cx(n) representing the sub-band pairs illustrated in graphs 124, 126, and 128 are now available.

Figure 6:
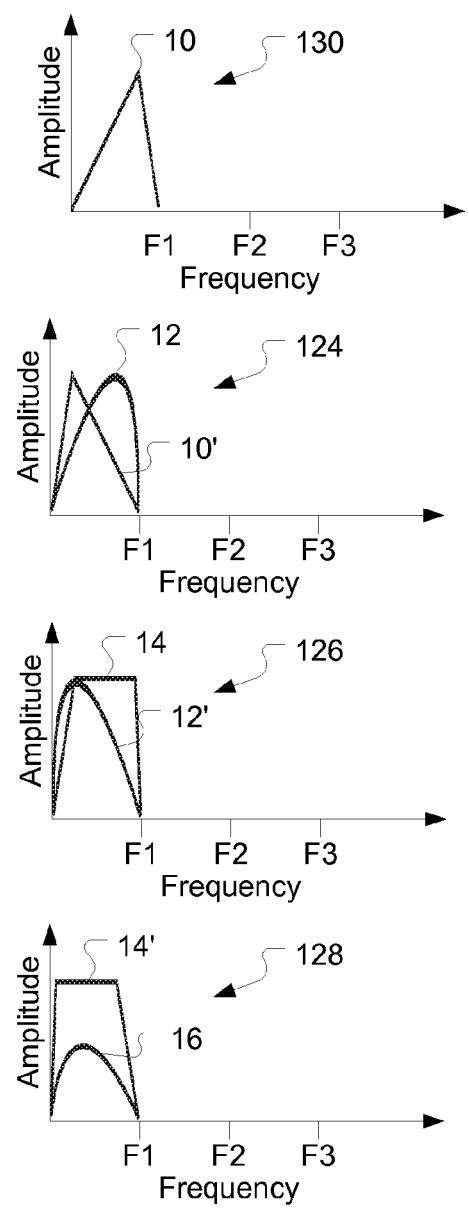
FIG. 6 is a diagram illustrating sub-band pairs isolated in FIG. 5.

FIG. 6 is a diagram illustrating sub-band pairs isolated in FIG. 5. Although not a sub-band pair, graph 130 illustrates sub-band 10. Graph 124 illustrates a sub-band pair with sub-bands 10' and 12. Graph 126 illustrates a sub-band pair with sub-bands 12' and 14. Graph 128 illustrates a sub-band pair with sub-bands 14' and 16. Now that sub-band pairs have been isolated, the individual sub-bands can be isolated.

Sub-band 12 of the sub-band pair of graph 124 of FIG. 6 is not in its original frequency position. It is shifted down in frequency by frequency F1. Similarly, sub-bands 14 and 16 in graphs 126 and 128 are shifted down in frequency by frequency F2 and F3, respectively.

Figure 7:
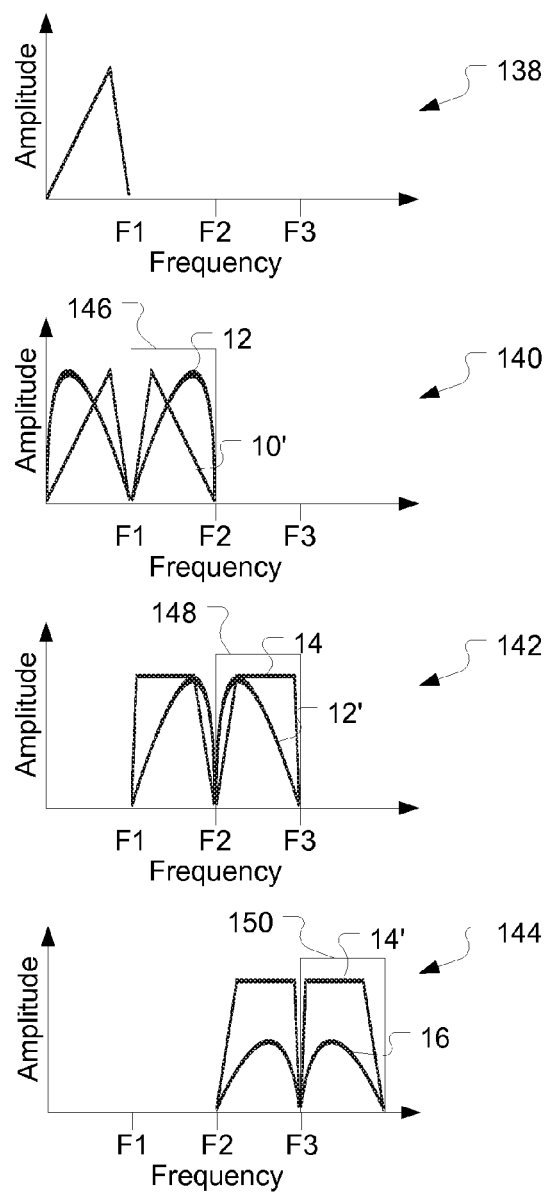
FIG. 7 is a diagram illustrating sub-band pairs of FIG. 6 modulated to a higher frequency.

FIG. 7 is a diagram illustrating sub-band pairs of FIG. 6 modulated to a higher frequency. Graph 138 represents sub-band 10. Since sub-band 10 is in its original frequency position, it does not need to be moved in frequency.

Equations 13-15 describe the modulation of the sub-bands back to their respective original frequencies.

$$b1(n) = \sum_m ha(m)[c1(n-m) \cdot \sin(\omega1(n-m) - \phi1)] \tag{13}$$

$$b2(n) = \sum_m hb(m)[c2(n-m) \cdot \sin(\omega2(n-m) - \phi2)] \tag{14}$$

$$b3(n) = \sum_m hc(m)[c3(n-m) \cdot \sin(\omega3(n-m) - \phi3)] \tag{15}$$

At this point, the modulation is performed with the sub-band pairs cx(n). Each sub-band pair cx(n) is modulated with the associated periodic signal represented here by ω1, ω2, and ω3. As can be seen in equations 13-15, the phases φ1, φ2, and φ3 are introduced into the equations to apply the appropriate phase during modulation.

Since this form of modulation introduces an image, the image needs to be filtered out. Thus, filters 146, 148, and 150 isolate the sub-band pairs from the modulated signals. In equations 13-15, filters 146, 148, and 150 are represented by ha(m), hb(m), and hc(m), respectively. Since cx(n) is in the time domain in this example, the filters ha, hb, and hc are convolved with the modulated signals.

Figure 8:
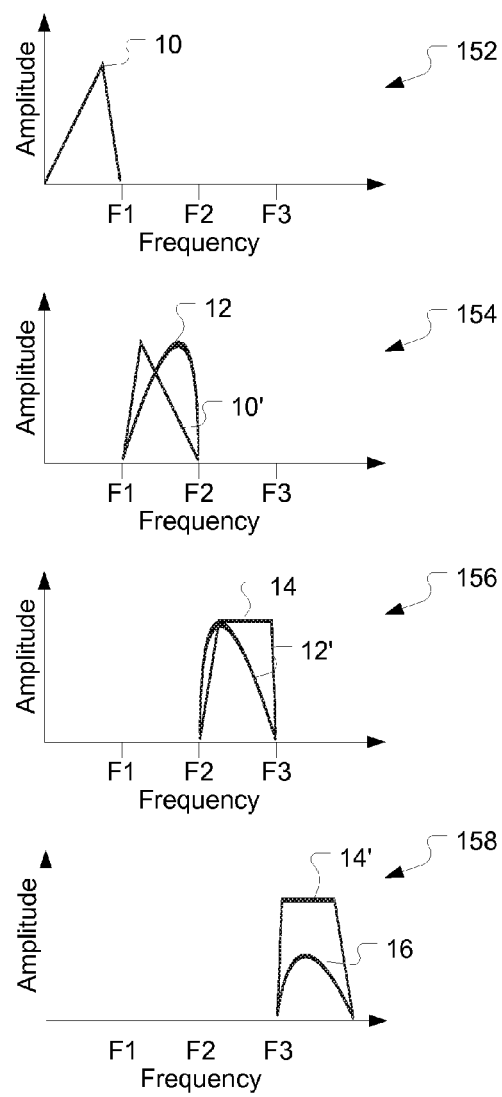
FIG. 8 is a diagram illustrating modulated sub-band pairs of FIG. 7 after filtering.

FIG. 8 is a diagram illustrating modulated sub-band pairs of FIG. 6 after filtering. The sub-band pairs have been frequency shifted to an original frequency of one of the sub-bands of the pair. However, each sub-band pair still has an overlapping mirrored sub-band. Graph 152 shows sub-band 10 in its original frequency range for reference. Graph 154 shows sub-band 12 with mirrored sub-band 10'. Graph 156 shows sub-band 14 with mirrored sub-band 12'. Graph 158 shows sub-band 16 with mirrored sub-band 14'. Thus, the original sub-bands 10, 12, 14, and 16 of the input signal 21 all are available at their appropriate frequency; however, sub-bands 12, 14, and 16 have overlapping mirrored sub-bands 10', 12', and 14'.

Figure 9:
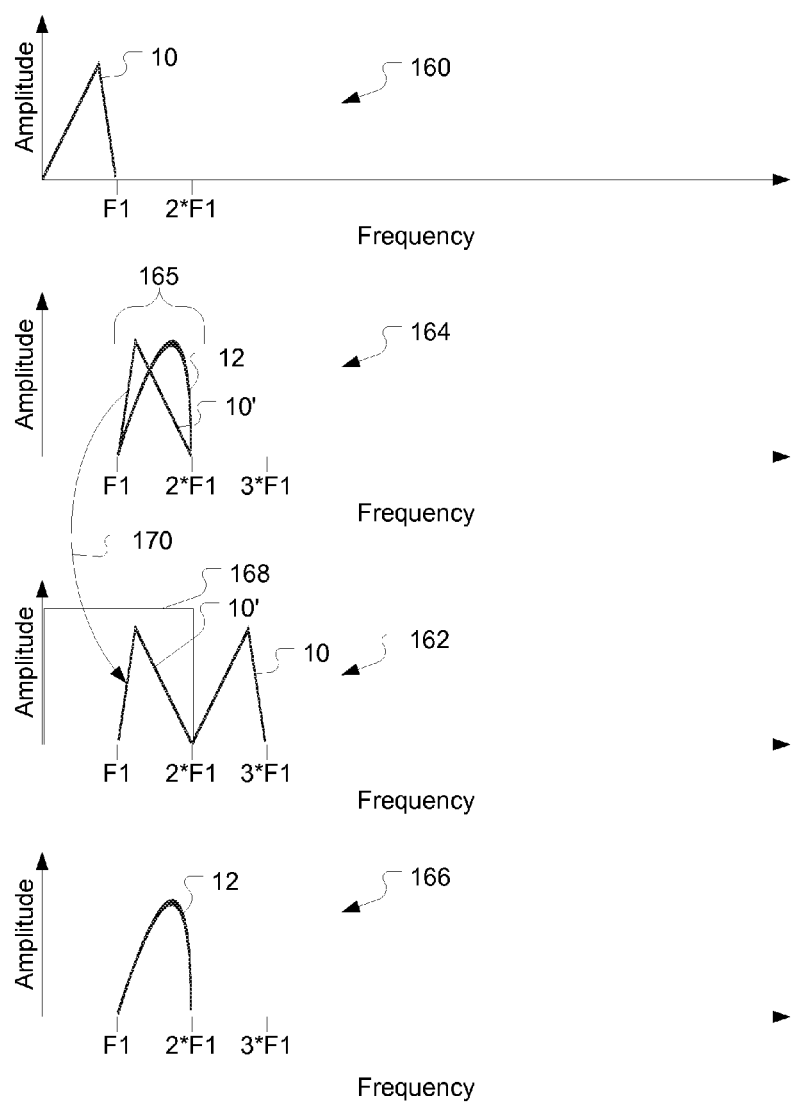
FIGS. 9-11 are diagrams illustrating isolation of sub-bands from the sub-band pairs of FIG. 8.
Figure 10:
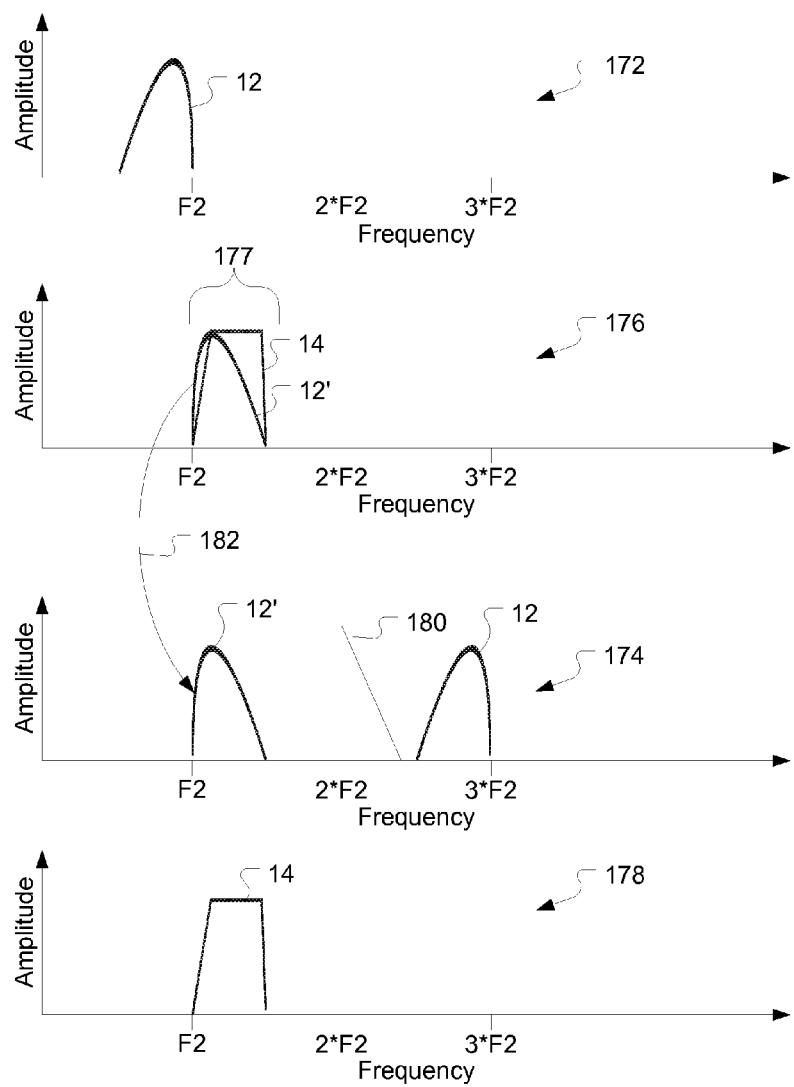
Figure 11:
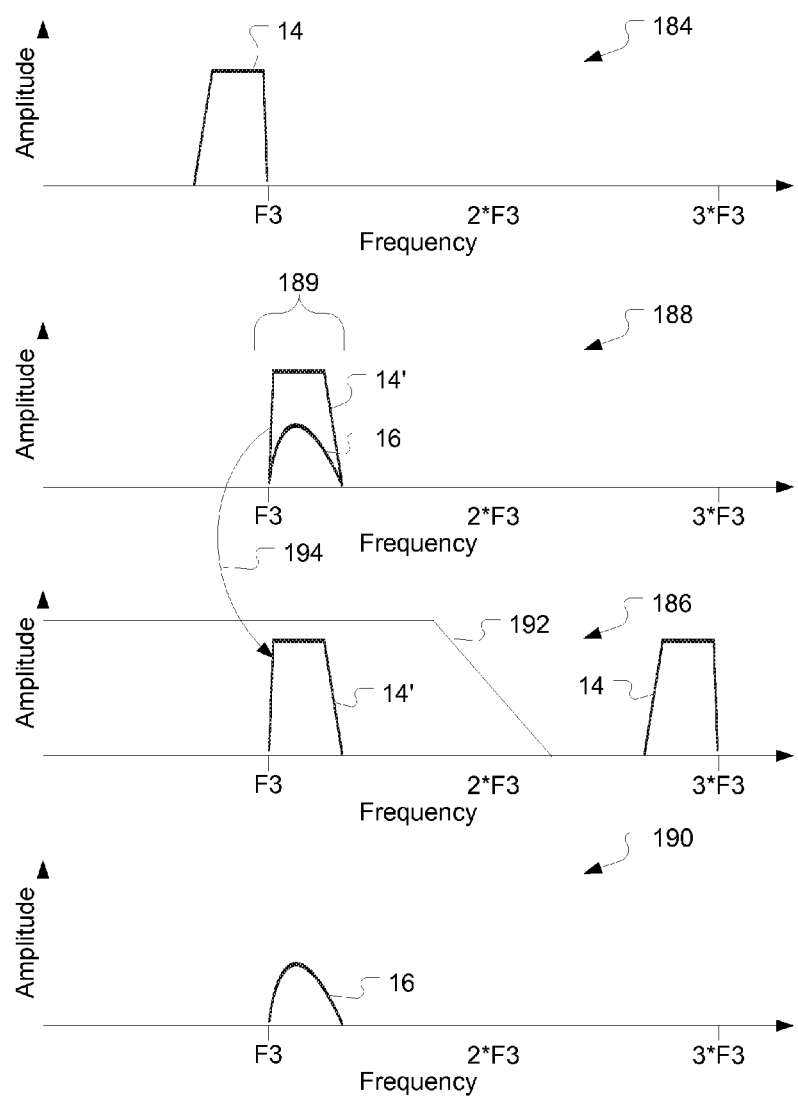

FIGS. 9-11 are diagrams illustrating isolation of sub-bands from the sub-band pairs of FIG. 8. With reference to FIG. 9, sub-band 10 of graph 160 is used to remove the mirrored sub-band 10' from the sub-band pair 165 of graph 164. Chart 160 illustrates sub-band 10 as it was isolated from the input signal 21.

It should be noted that digitizer 48 digitizes the input signal 21, not a mixed signal. Sub-band 10 was the sub-band that was already within the bandwidth of the digitizer 48, and was not mixed down in frequency. Sub-band 10 remains at its original frequency and does not have any overlapping sub-bands. Although sub-band 10 of graph 160 does not have overlapping sub-bands to be removed, it is not in the proper frequency band to remove the mirrored sub-band 10' from sub-band pair 165.

Sub-band pair 165 includes sub-band 12 and mirrored sub-band 10'. Relative to sub-band 10 of graph 160, the mirrored sub-band 10' is reversed in frequency and frequency shifted. To create a mirrored sub-band 10' suitable to cancel the mirrored sub-band 10' in the sub-band pair 165, sub-band 10 must be frequency shifted and reversed. In order to match in frequency, frequencies of sub-band 10' beginning at F1 and extending lower in frequency should be transformed to frequencies beginning at F1 and extending higher in frequency.

To accomplish this, sub-band 10 is used to modulate a signal with a frequency of two times frequency F1(2*F1). Chart 162 illustrates this modulated signal. Using amplitude modulation, two sidebands are obtained. Both sidebands are frequency shifted sub-bands 10 and 10'; however, the lower sideband has sub-band 10', which is reversed in frequency.

The lower sideband is sub-band 10' frequency shifted and frequency reversed and can be used to cancel the mirrored sub-band 10' of sub-band pair 165. A filter 168 is used to eliminate the upper sideband, leaving only the lower sideband for use in cancellation. Although amplitude modulation and filtering has been described as a technique to obtain the desired sub-band, other techniques can be used to achieve the same result. For example, sub-band 10 could be used in a single sideband modulation technique with the lower sideband selected. Thus, the result of the modulation alone would be the desired frequency shifted and mirrored sub-band 10'.

It should be noted that in this example, to get a mirrored sub-band for cancellation in a sub-band pair, a signal with a frequency double that of the frequency of the periodic signal used to originally frequency shift the desired sub-band is used. A periodic signal with frequency F1 was used to shift sub-band 12 down in frequency. At the same time, sub-band 10 was frequency shifted and mirrored into mirrored sub-band 10'. In sub-band 10, the original frequencies extending from 0 to F1 were transformed to frequencies from F1 to 0. When the sub-band pair containing the mirrored sub-band 10' was modulated to frequency shift it back to the original frequency of sub-band 12, mirrored sub-band 10 was frequency shifted up by frequency F1 as well. However, in this case, it was not frequency mirrored. Thus, frequencies F1 to 0 of the mirrored sub-band 10' were transformed to frequency range F1+F1 to 0+F1, or 2*F1 to F1.

When using sub-band 10 to modulate a frequency of 2*F1, lower frequencies around 0 are transformed to around 2*F1 in the lower sideband. Upper frequencies around F1 are transformed to frequencies around 2*F1–F1, or F1 in the lower sideband. Thus, using an original sub-band 10 to modulate a signal with a frequency of 2*F1, the sub-band 10 frequency range of 0 to F1 is transformed to 2*F1 to F1, identical to the frequency range of the mirrored sub-band 10' in the sub-band pair 165 to be eliminated.

Arrow 170 indicates the sub-band 10 from the modulation of signal used to eliminate the mirrored sub-band 10' from the sub-band pair 165. Thus, as shown in graph 166, the remaining sub-band is sub-band 1 is now available without the overlapping mirrored sub-band 10. Equation 16 is an example of the mathematics to remove the mirrored sub-band 10, where a1 is the desired sub-band 12, b1 is the sub-band pair 165, h1 is the image removing filter 168, and b0 is the sub-band 10.

$$a1 = b1 - h1*(b0*\sin(2*\omega 1)) \quad (16)$$

Although particular examples of phases, polarities, addition, and subtraction have been described above, the removal of a mirrored sub-band can be performed using any appropriate combination to cancel the mirrored sub-band.

FIG. 10 illustrates the removal of mirrored sub-band 12' from the sub-band pair 177. Graph 172 illustrates sub-band 12 as isolated as described with reference to FIG. 9. As illustrated in graph 176, sub-band pair 177 includes a mirrored sub-band 12'. Sub-band 12 is used to modulate a double frequency signal. In this case the signal has a frequency of 2*F2 since a periodic signal with frequency F2 was used to frequency shift sub-band 14 from the input signal 21.

Graph 174 illustrates the result of modulating a signal with frequency 2*F2 with sub-band 12. Again, in this example, two sidebands are generated and a filter 180 eliminates the upper sideband. The resulting lower sideband is used to cancel the mirrored sub-band 12' in the sub-band pair 177 as illustrated by arrow 182. Graph 178 illustrates the isolated sub-band 14 at its original frequency range. Equation 17 is an example of the mathematics to remove the mirrored sub-band 12', where a2 is the desired sub-band 14, b2 is the sub-band pair 177, h2 is the image removing filter 180, and a1 is the sub-band 12 isolated as described in equation 16.

$$a2 = b2 - h2*(a1*\sin(2*\omega 2)) \quad (17)$$

FIG. 11 illustrates the removal of mirrored sub-band 14' from the sub-band pair 189. Graph 184 illustrates sub-band 14 as isolated as described with reference to FIG. 10. As illustrated in graph 188, sub-band pair 189 includes a mirrored sub-band 14'. Sub-band 14 is used to modulate a double frequency signal. In this case the signal has a frequency of 2*F3 since a periodic signal with frequency F3 was used to frequency shift sub-band 14 from the input signal 21.

Graph 186 illustrates the result of modulating a signal with frequency 2*F3 with sub-band 14. Again, in this example, two sidebands are generated with a filter 192 eliminates the upper sideband. The resulting lower sideband is used to cancel the mirrored sub-band 14' in the sub-band pair 189 as illustrated by arrow 194. Graph 190 illustrates the isolated sub-band 16 at its original frequency range. Equation 18 is an example of the mathematics to remove the mirrored sub-band 14', where a3 is the desired sub-band 16, b3 is the sub-band pair 189, h3 is the image removing filter 192, and a2 is the sub-band 14 isolated as described in equation 17.

$$a3 = b3 - h3*(a2*\sin(2*\omega 3)) \quad (18)$$

Although filters 168, 180, and 192 have been illustrated with particular shapes, the filters 168, 180, and 192 need only eliminate the unwanted sideband. Thus, the cutoff frequency need only be somewhere between the sidebands created by the modulation. For example, in FIG. 11, the filter 192 could have a cutoff frequency anywhere between the sidebands centered around 2*F3. Similarly, the filters 168, 180, and 192 need not be low-pass filters as illustrated. Filters 168, 180, and 192 could be band-pass filters shaped to pass the desired sideband.

Interpolation may be needed before computing equations 16, 17, and 18 so that images will not be aliased. Referring to FIG. 11, in graph 186, the modulated signal has a sideband extending up to 3*F3. The digitized signal must accurately reconstruct such signals. As a result, the sample rate should be greater than or equal to two times the highest desired frequency, or 6*F3. Similar sample rate requirements can apply for other modulations described herein.

In some cases, a lower sample rate than described above can be used. Aliasing of the upper sideband can be allowed as long as the aliased signal is not within the region of the desired signal region to be passed by the filtering. In addition, it is possible to perform multiple stages of modulation with multiple filters to eliminate the requirement of interpolation.

In equations 16-18, signals with varying samples rates can be combined through a variety of techniques. For example, all signals can be interpolated to the maximum needed sample rate. In another example, combinations of interpolation and decimation can be performed.

Now that sub-bands 10, 12, 14, and 16 have been restored to their original frequency and overlapping mirrored sub-bands have been removed, the sub-bands 10, 12, 14, and 16 can be combined into the reconstructed input signal 65. A filter h can be used to correct for errors in crossover regions between sub-bands. Equation 19 is an example of the mathematics to recombine the sub-bands 10, 12, 14, and 16, where b0 is sub-band 10, a1, a2, and a3 are the isolated sub-bands 12, 14, and 16 described above, and y is the reconstructed input signal 65.

$$y = h*(b0 + a1 + a2 + a3) \quad (18)$$

Thus, a reconstructed signal 65 is now available, representing the full bandwidth of the input signal 21 through digitizers 48, 50, 52, and 54 with limited bandwidths.

Figure 12:
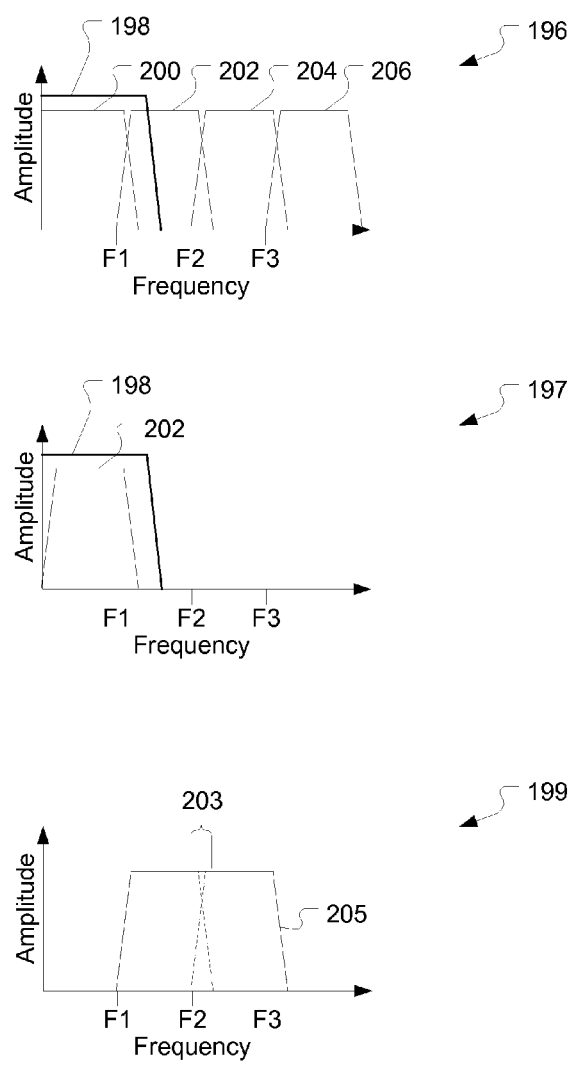
FIG. 12 is a diagram illustrating a relationship of filter bandwidths in a test and measurement instrument according to an embodiment of the invention.

FIG. 12 is a diagram illustrating a relationship of filter bandwidths in a test and measurement instrument according to an embodiment of the invention. In this embodiment, the frequencies of the periodic signals 78, 80, and 82 can be setup as shown in FIG. 11 such that the sub-bands can be filtered for more accurate signal reconstruction in the crossover regions.

Filters 200, 202, 204, and 206 are examples of filters used in the reconstruction of the input signal 21. In this example, filter 200 falls within the flat response of the bandwidth 198 of a digitizer 48. To capture lower frequencies, filter 200 can be a low-pass filter.

Filters 202, 204, and 206 each are to filter an associated sub-band. The sub-bands will be frequency shifted down by their respective periodic signals. Graph 197 illustrates the filter 202 associated with frequency F1 after frequency shifting to be within the bandwidth 198 of the digitizer 48. In this example, the entire filter 202 falls within the flat pass-band of the bandwidth 198. Similarly, filters 204, and 206 would be within the flat pass-band of the bandwidth 198 when frequency shifted by their associated periodic signals F2 and F3.

Although the filters have been described as being frequency shifted, the frequency shifting was for illustration. The filters 202, 204, and 206 were described as frequency shifted to illustrate the shape of a filter at its original frequency range with reference to the bandwidth 198 of a digitizer. The filters 202, 204, and 206, can, but need not be frequency shifted and used as such. Such filtering can be performed when associated sub-bands are frequency shifted lower in frequency. Alternatively, the sub-bands can be filtered when they are restored to their original frequencies. As long as the filtering is applied such that the elimination of a mirrored sub-band from a sub-band pair is not affected, the filtering can be distributed as desired.

In the filters described in graph 196, the crossover regions can have a phase and magnitude response such that a summation of two filters will result in a flat magnitude and linear phase response over the crossover region. In addition the band-pass region of the filters can have a flat magnitude and linear phase response.

Graph 199 illustrates an example of the combination of filters 202 and 204. Filter 205 is the sum of filters 202 and 204. In the crossover region 203, the filter 205 has a flat magnitude response. Dashed lines indicate the original edges of filters 202 and 204 for reference.

Figure 13:
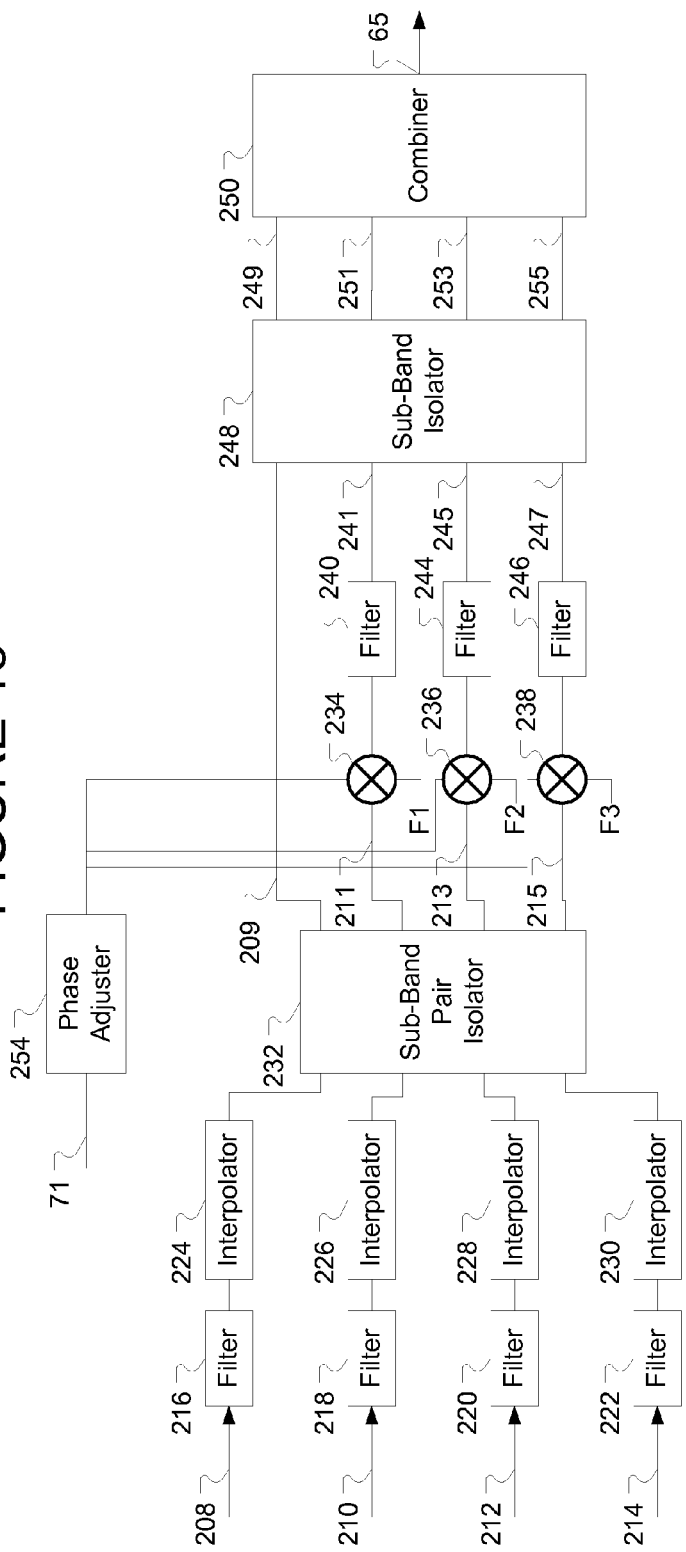
FIG. 13 is a block diagram of an example of a signal reconstruction block of FIG. 1.

Referring to FIG. 1, a signal reconstruction block 64 can perform the above described techniques to create a reconstructed input signal 65 from the digitized mixed signals and the digitized split signal. FIG. 13 is a block diagram of an example of a signal reconstruction block 64 of FIG. 1.

In this embodiment, the signal reconstruction block 64 includes a sub-band pair isolator 232, modulators 234, 236, and 238, a sub-band isolator 248, and a combiner 250. As described above, the digitized split signal 208 and mixed signals 210, 212, and 214 can be filtered before isolating the sub-band pairs. In addition, the signals can be interpolated before isolating the sub-band pairs. Filters 216, 218, 220, and 222, and interpolators 224, 226, 228, and 230 can perform those operations.

The sub-band pair isolator 232 is configured to isolate a sub-band pair associated with each periodic signal from the digitized mixed signals. The sub-band pair isolator 232 receives the digitized split signal 208 and mixed signals 210, 212, and 214 as filtered and interpolated as desired. As described with reference to FIG. 4, sub-band pairs 211, 213, and 215 are isolated from the signals.

Sub-band 209 is the original lowest frequency sub-band that could pass through the bandwidth of digitizer 48. Although illustrated as passing through sub-band isolator 232, the sub-band 209 may not be affected by the sub-band pair isolator 232. Alternatively, the sub-band pair isolator 232 can apply the filtering as described with reference to FIG. 12 or other signal shaping. In which case, sub-band 209 would be affected by the sub-band pair isolator 232.

Modulators 234, 236, and 238 are configured to modulate an associated sub-band pair 211, 213, and 215 with the associated periodic signal F1, F2, and F3. Such modulation is described above in reference to FIG. 7. Filters 240, 244, and 246 filter unwanted images from the modulated signals. As a result, frequency shifted sub-band pairs 241, 245, and 247 are available for the sub-band isolator 248.

The sub-band isolator 248 is configured to isolate a sub-band from each sub-band pair. As described above with reference to FIGS. 9, 10, and 11 sub-bands are isolated using the sub-band 209 and the frequency shifted sub-band pairs 241, 245, and 247. The combiner 250 is configured to combine the isolated sub-bands 249, 251, 253, and 255 into the reconstructed input signal 65.

As described above, the isolation of the sub-bands from the sub-band pairs can be performed sequentially. That is, sub-band 209, without any overlapping sub-bands, is first used to isolate sub-band 251 from sub-band pair 241. Then, sub-band 251 is used to isolate sub-band 253 from sub-band pair 245. Lastly, sub-band 253 is used to isolate sub-band 255 from sub-band pair 247. Thus, the sub-band isolation occurs sequentially. The sub-band isolator 248 can includes a sequential sub-band isolator to isolate a first sub-band in response to a baseband sub-band and to isolate subsequent sub-bands in response to a previously isolated sub-band.

As described above, the periodic signals 78, 80, and 82 can have varied phase relationships. The signal reconstruction block 64 can include a phase adjuster 254 to adjust the phase of the periodic signal used to modulate each sub-band pair in response to a periodic signal phase input 71 for each periodic signal. Although illustrated as one line, the periodic signal phase input 71 can have multiple lines, multiple signals, or the like. The periodic signal phase input 71 carries the information regarding the phases of the periodic signals relative to the trigger and/or the sample clocks of the digitizers 50, 52, and 54. As a result, in the modulators 234, 236, and 238, the proper phase relationship of the periodic signals can be used to modulate the sub-band pairs 211, 213, and 215 back to their original frequency ranges.

Noise considerations are an aspect of test and measurement instrument architecture. Oscillators, mixers, preamplifiers, digitizers, and other components contribute noise. For example, the fact that a four way power splitter 20 is used will bring the input signal level down closer to the noise floor, reducing SNR (signal to noise ratio).

In an embodiment described above, each sub-band set has three sub-band pairs. This reduces the headroom of the preamplifier and digitizer part of the channel by a factor of three. Thus, there is a factor of 3 loss in SNR. However, the solution of equation 12 involves three equations and three unknowns based on signals from three different channels. The noise in each of these three channels is mostly uncorrelated. Thus, the solution would have an averaging effect that would tend to improve the noise ratio by a factor of the square root of 3.

The noise performance can be improved for this architecture by assigning some of the oscillator coefficients to be zero before summation of the oscillators. As described above, a coefficient for a combiner 36 could be 1, 1, and −1. In the example described here, the coefficients could be 1, 0, −1. This would result in only two sub-band pairs per sub-band set instead of three. Thus, headroom would only be reduced by a factor of 2 rather than a factor of 3. Consequently, SNR is reduced by 2 and improved by the square root of 2 resulting in improved noise performance over an architecture with more oscillators affecting each sub-band set. In addition, the hardware configuration could be less complex. For example, the combiners 36, 38, and 40 would only need to combine two periodic signals instead of three.

Furthermore, switching circuitry can allow the user to choose to not include specified sub-bands in the waveform reconstruction. This would be selected from a menu by the user when they know that there is no significant signal energy in specific bands or if they want to remove part of the signal in one or more of the bands. This can lower the system noise level.

For example, the combiners 36, 38, and 40 can have controls for the coefficients affecting the periodic signals. By setting particular coefficients to 0 in one or more of the combiners and eliminating one or more of the mixed signals from the calculation, a particular sub-band can be eliminated.

Figure 14:
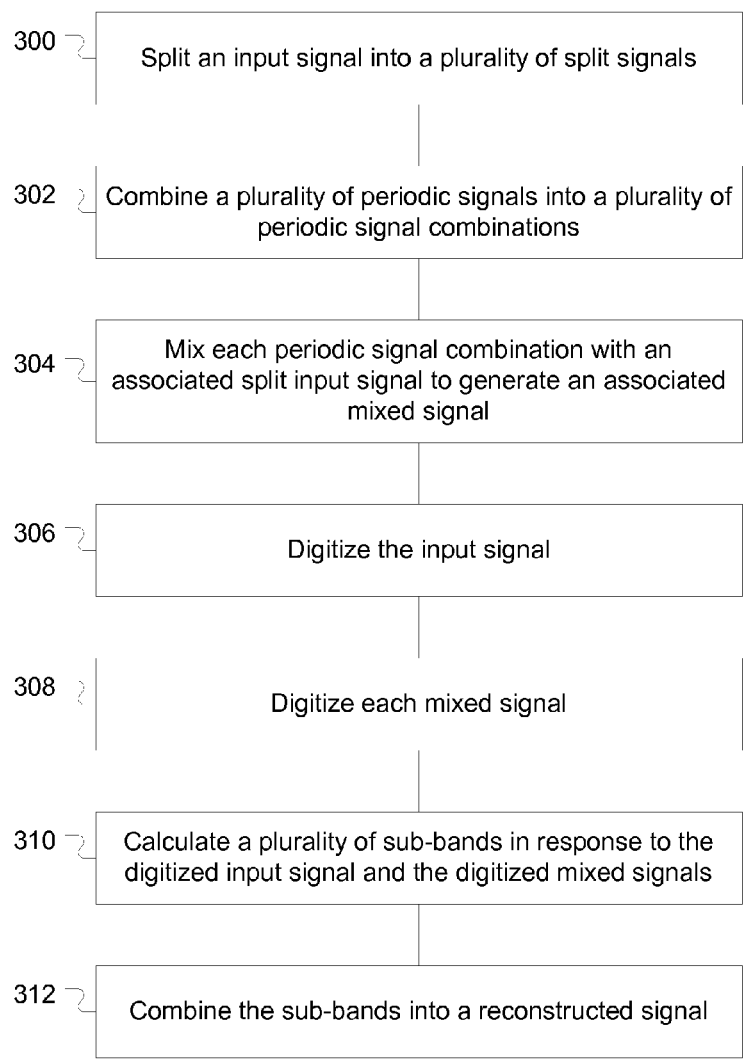
FIGS. 14-18 are flowcharts illustrating methods of digitizing an input signal for a test and measurement instrument according to various embodiments of the invention.

FIGS. 14-18 are flowcharts illustrating methods of digitizing an input signal for a test and measurement instrument according to various embodiments of the invention. Referring to FIG. 14, a method includes splitting an input signal into a plurality of split signals in 300, combining a plurality of periodic signals into a plurality of signal combination in 302, mixing each signal combination with an associated split input signal to generate an associated mixed signal in 304, digitizing the input signal in 306, digitizing each mixed signal in 308, calculating a plurality of sub-bands in response to the digitized input signal and the digitized mixed signals in 310, and combining the sub-bands into a reconstructed signal in 312.

As described above a splitter 20 can split the input signal into equal or unequal parts. Splitting an input signal into a plurality of split signals in 300 includes such equal or unequal splitting. Furthermore, splitting the input signal can include signal shaping.

Combining a plurality of periodic signals into a plurality of signal combination in 302 can include summing periodic signals together. In another example, the combination can be performed inherently through a signal generator that generates a substantially non-periodic signal having the periodic signals as components.

Mixing each signal combination with an associated split input signal to generate an associated mixed signal in 304 includes any function that can multiply a signal combination with a split signal. Thus, the mixing can be performed by mixers, multipliers, and other non-linear devices.

Digitizing the input signal in 306 and digitizing each mixed signal in 308 can be performed by the digitizers described above. The digitizing in 306 and 308 can include any amplifying, filtering, interpolating, amplitude matching, phase matching, or the like as desired.

Calculating the sub-bands in response to the digitized input signal and the digitized mixed signals in 310 includes operations such as the examples described above.

Combining the sub-bands into the reconstructed signal in 312 can include summing the sub-bands. The summing can be performed in one stage or in various stages as desired. Furthermore, the combining of the sub-bands can include signal shaping or other filtering as desired.

As described above, each signal combination is substantially non-periodic. Thus, the signal combinations could be substantially non-periodic over a digitizing period in which the mixed signals are digitized.

Figure 15:
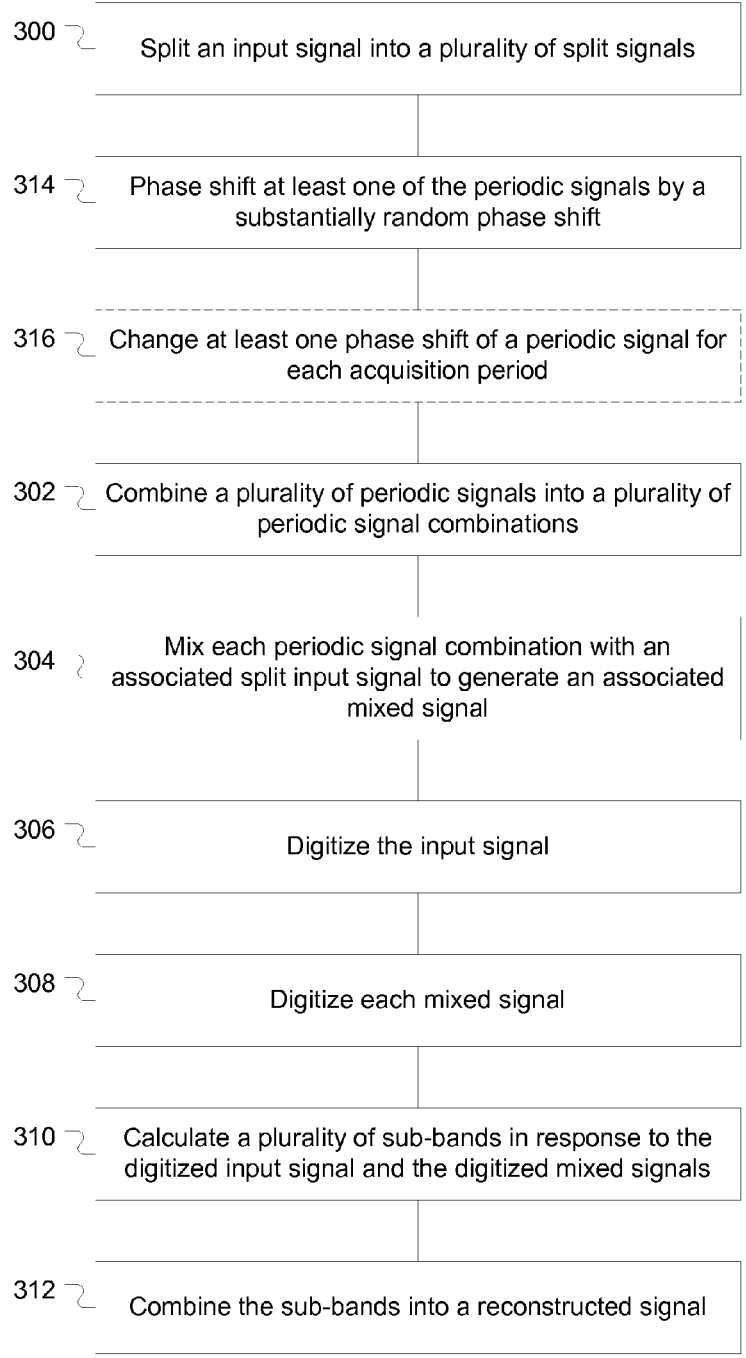

FIG. 15 illustrates phase shifting periodic signals in a method of digitizing an input signal for a test and measurement instrument. The method includes phase shifting at least one of the periodic signals by a substantially random phase shift in 314. The phase shifting of the periodic signals can include changing at least one phase shift of a periodic signal for each acquisition period in 316.

As described above, a noise source can be used to generate phase adjustment signals. Thus, the random phase shift can be generated from a noise source. The random phase shift can be used to control phases of the oscillators generating the periodic signals.

In one embodiment, the method includes, for at least one signal combination, combining the associated periodic signals includes combining the associated periodic signals with different complex weights. As a result, linear independent equations can be generated to solve for the sub-band pairs using the sub-band sets.

Figure 16:
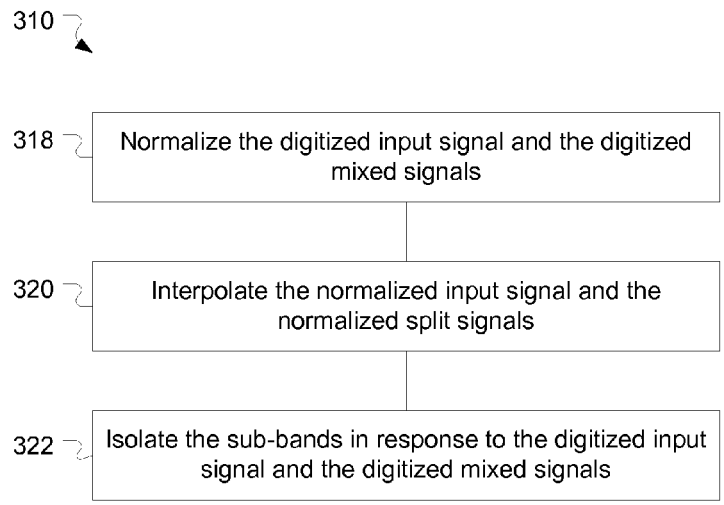

FIG. 16 illustrates an example of calculating the sub-bands in a method of digitizing an input signal for a test and measurement instrument. The method includes normalizing the digitized input signal and the digitized mixed signals in 318, interpolating the normalized input signal and the normalized split signals in 320, and isolating the sub-bands in response to the digitized input signal and the digitized mixed signals in 322. As described above, the sub-bands can be isolated and recombined into the reconstructed input signal 65. Furthermore, as described above, the sub-bands can be sequentially isolated.

Figure 17:
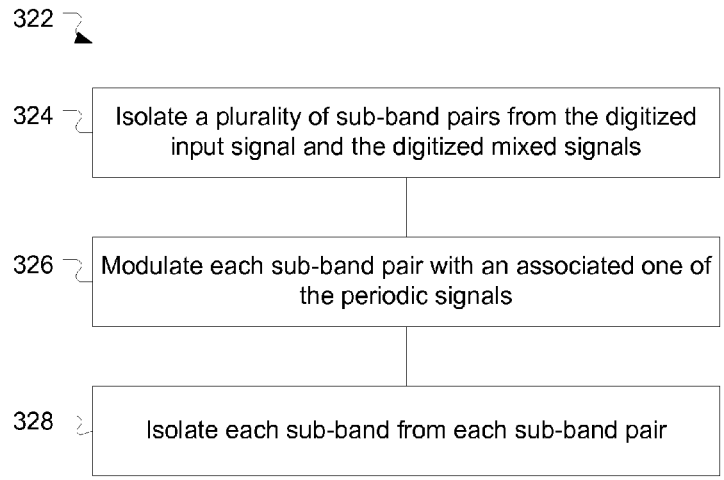

FIG. 17 illustrates an example of isolating the sub-bands in a method of digitizing an input signal for a test and measurement instrument. The method includes isolating a plurality of sub-band pairs from the digitized input signal and the digitized mixed signals in 324, modulating each sub-band pair with an associated one of the periodic signals in 326, and isolating each sub-band from each sub-band pair in 328. As a result, the sub-bands can be isolated as described above.

Figure 18:
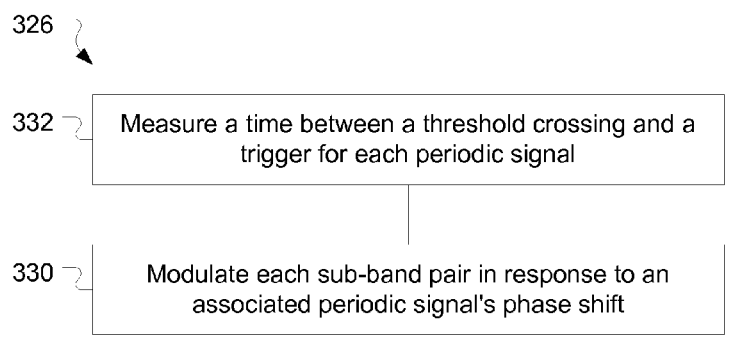

FIG. 18 illustrates an example of modulating sub-band pairs in a method of digitizing an input signal for a test and measurement instrument. The method includes measuring a time between a threshold crossing and a trigger for each periodic signal in 332, and modulating each sub-band pair in response to an associated periodic signal's phase shift in 330. As a result, the modulation of the sub-band pairs in 326 can be performed using the phase of the periodic signals used to frequency shift the sub-bands.

An embodiment includes a test and measurement instrument including means for splitting an input signal into a plurality of split signals, means for combining a plurality of periodic signals into a plurality of signal combination, means for mixing each signal combination with an associated split input signal to generate an associated mixed signal, means for digitizing the input signal, means for digitizing each mixed signal, means for calculating a plurality of sub-bands in response to the digitized input signal and the digitized mixed signals, and means for combining the sub-bands into a reconstructed signal. Each signal combination is substantially non-periodic.

Another embodiment of a test and measurement instrument includes means for phase shifting at least one of the periodic signals by a substantially random phase shift.

Another embodiment of a test and measurement instrument includes means for normalizing the digitized input signal and the digitized mixed signals, means for interpolating the normalized input signal and the normalized split signals, and means for isolating the sub-bands in response to the digitized input signal and the digitized mixed signals.

Another embodiment of a test and measurement instrument includes means for isolating a plurality of sub-band pairs from the digitized input signal and the digitized mixed signals, means for modulating each sub-band pair with an associated one of the periodic signals, and means for isolating each sub-band from each sub-band pair.

Several advantages result from an embodiment of the test and measurement instrument. The bandwidth can be extended by a factor of almost Q times the bandwidth of a single channel, where Q is the number of digitizing channels used for acquisition. For example, using four digitizing channels, a 15 GHz scope could be extended to 50 GHz if the components can be built to operate over that range.

In addition, the test and measurement instrument is capable of single shot extended bandwidth. Through the use of the comparators 72, 74, and 76, and the trigger system 70, the relationship of the periodic signals, particularly the phases of the periodic signals, to the trigger and/or sample clock, a single trigger event can be used to start the acquisition Furthermore, since each sub-band passes through multiple mixers, mixer channel mismatch error is reduced because all three modulated bands pass through all three mixers. As a result, the errors tend to average out. This increased tolerance for mismatch is provided by the architecture configuration.

This disclosure has presented the theory and mathematics to explain embodiments of the invention. An actual implementation may vary from the particular examples set out above. For example, additional processing might be required. The frequency of the periodic signals may be slightly different then ¼ band. Some band overlap can be used. Additional steps may be used to remove images associated with that the band overlap. Furthermore, different equations and procedural steps may be followed to obtain the same results.

In addition, although filtering has been described in various locations for various applications, the filtering can be distributed across components and systems as desired. Such distribution can take into account frequency shifting and mirroring so that the result of the filtering if performed as described above is substantially the same.

Another embodiment includes an article of machine readable code embodied on a machine readable medium that when executed, causes the machine to perform any of the above-described operations. As used here, a machine is any device that can execute code. Microprocessors, programmable logic devices, multiprocessor systems, digital signal processors, personal computers, or the like are all examples of such a machine.

Although particular embodiments have been described, it will be appreciated that the principles of the invention are not limited to those embodiments. Variations and modifications may be made without departing from the principles of the invention as set forth in the following claims.

The invention claimed is:

1. An acquisition apparatus for a test and measurement instrument comprising:
    a splitter configured to split an input signal into a plurality of split signals;
    a plurality of oscillators, each oscillator configured to generate a periodic signal;
    a plurality of combiners, each combiner configured to combine an associated plurality of the periodic signals into an associated signal combination;
    a plurality of mixers, each mixer configured to mix an associated split signal and an associated signal combination into an associated mixed signal;
    a first digitizer configured to digitize an associated split signal; and
    a plurality of second digitizers, each second digitizer configured to digitize an associated mixed signal;
    wherein at least one of the signal combinations is substantially non-periodic.

2. The apparatus of claim 1, further comprising:
    a plurality of comparators, each comparator configured to detect a crossing of an associated one of the periodic signals.

3. The apparatus of claim 1, further comprising:
    a signal reconstruction block configured to create a reconstructed input signal from the digitized mixed signals and the digitized split signal.

4. The apparatus of claim 1, further comprising:
    a sub-band pair isolator to isolate a sub-band pair associated with each periodic signal from the digitized mixed signals;
    a plurality of modulators, each modulator configured to modulate an associated sub-band pair with the associated periodic signal;
    a sub-band isolator to isolate a sub-band from each sub-band pair; and
    a combiner to combine the isolated sub-bands into the reconstructed input signal.

5. The apparatus of claim 4, further comprising:
    a sequential sub-band isolator to isolate a first sub-band in response to a baseband sub-band and to isolate subsequent sub-bands in response to a previously isolated sub-band.

6. The apparatus of claim 4, further comprising:
    a phase adjuster to adjust the phase of the periodic signal used to modulate each sub-band pair in response to a periodic signal phase input for each periodic signal.

7. The apparatus of claim 1, further comprising:
    a phase randomizer coupled to the oscillators;
    wherein phases of the periodic signals are responsive to the phase randomizer.

8. The apparatus of claim 7, wherein the phase randomizer comprises:
    a random signal generator;
    wherein the phases of the periodic signals are responsive to the random signal generator.

9. The apparatus of claim 7, wherein the phase randomizer comprises:
    a noise generator configured to generate a noise signal;
    a comparator configured to compare the noise signal to a threshold to generate a clipped noise signal; and
    phase control logic configured to generate phase control signals for the oscillators in response to the clipped noise signal.

10. The apparatus of claim 1, wherein for each combiner:
    at least one periodic signal is combined into the combined periodic signal using a coefficient different from at least one other periodic signal in the combination.

11. A method of digitizing an input signal for a test and measurement instrument comprising:
    splitting an input signal into a plurality of split signals;
    combining a plurality of periodic signals into a plurality of signal combinations, wherein each signal combination is substantially non-periodic;
    mixing each signal combination with an associated split input signal to generate an associated mixed signal;
    digitizing the input signal;
    digitizing each mixed signal;
    calculating a plurality of sub-bands in response to the digitized input signal and the digitized mixed signals; and
    combining the sub-bands into a reconstructed signal.

12. The method of claim 11, wherein:
    each signal combination is non-periodic during a digitizing period in which the mixed signals are digitized.

13. The method of claim 11, further comprising:
    phase shifting at least one of the periodic signals by a substantially random phase shift.

14. The method of claim 13, further comprising:
    changing at least one phase shift of a periodic signal for each acquisition period.

15. The method of claim 13, further comprising:
generating the substantially random phase shift from a noise source.

16. The method of claim 11, wherein:
for at least one signal combination, combining the associated periodic signals includes combining the associated periodic signals with different complex weights.

17. The method of claim 11, further comprising:
normalizing the digitized input signal and the digitized mixed signals;
interpolating the normalized input signal and the normalized split signals; and
isolating the sub-bands in response to the digitized input signal and the digitized mixed signals.

18. The method of claim 17, further comprising:
isolating a plurality of sub-band pairs from the digitized input signal and the digitized mixed signals;
modulating each sub-band pair with an associated one of the periodic signals; and
isolating each sub-band from each sub-band pair.

19. The method of claim 18, further comprising:
measuring a time between a threshold crossing and a trigger for each periodic signal; and
modulating each sub-band pair in response to an associated periodic signal's phase shift.

20. The method of claim 17, wherein isolating the sub-bands further comprising:
sequentially isolating each sub-band.

21. A test and measurement instrument comprising:
means for splitting an input signal into a plurality of split signals;
means for combining a plurality of periodic signals into a plurality of signal combinations, wherein each signal combination is substantially non-periodic;
means for mixing each signal combination with an associated split input signal to generate an associated mixed signal;
means for digitizing the input signal;
means for digitizing each mixed signal;
means for calculating a plurality of sub-bands in response to the digitized input signal and the digitized mixed signals; and
means for combining the sub-bands into a reconstructed signal.

22. The test and measurement instrument of claim 21, further comprising:
means for phase shifting at least one of the periodic signals by a substantially random phase shift.

23. The test and measurement instrument of claim 21, further comprising:
means for normalizing the digitized input signal and the digitized mixed signals;
means for interpolating the normalized input signal and the normalized split signals; and
means for isolating the sub-bands in response to the digitized input signal and the digitized mixed signals.

24. The test and measurement instrument of claim 23, further comprising:
means for isolating a plurality of sub-band pairs from the digitized input signal and the digitized mixed signals;
means for modulating each sub-band pair with an associated one of the periodic signals; and
means for isolating each sub-band from each sub-band pair.

* * * * *